United States Patent [19]
Borgmeyer et al.

[11] Patent Number: 4,533,786
[45] Date of Patent: Aug. 6, 1985

[54] PADMOUNTED TRANSFORMER ENCLOSURE

[75] Inventors: Virgil L. Borgmeyer, Meta; Dudley L. Galloway, Jefferson City; Gary N. Sonnenberg, Jefferson City; Jan S. Gruczka, Jefferson City; Timothy C. Owen, Jefferson City, all of Mo.

[73] Assignee: Westinghouse Electric Corp., Pittsburgh, Pa.

[21] Appl. No.: 618,845

[22] Filed: Jun. 8, 1984

[51] Int. Cl.³ .............................................. H05K 5/04
[52] U.S. Cl. ........................................ 174/50; 336/90
[58] Field of Search ............... 174/50, 52 R; 336/65, 336/90; 312/100; 361/333, 334; D13/4

[56] References Cited
U.S. PATENT DOCUMENTS
3,784,727 1/1974 Haubein .............................. 174/50 X
3,841,032 10/1974 Grannis, III ...................... 174/50 X Primary Examiner—A. T. Grimley
Assistant Examiner—D. A. Tone
Attorney, Agent, or Firm—Donald R. Lackey

[57] ABSTRACT

A padmounted transformer enclosure including a tank, terminal cover and sill which cooperatively define a composite structure having no pointed upper corners. The tank-terminal cover interface, and the terminal cover-sill interface, are both square, requiring no matching of curved surfaces.

8 Claims, 7 Drawing Figures

PADMOUNTED TRANSFORMER ENCLOSURE

BACKGROUND OF THE INVENTION

1. Field of the Invention:

The invention relates in general to electrical transformer enclosures, and more specifically to padmounted transformer enclosures of the distribution type.

2. Description of the Prior Art:

Single phase, padmounted transformers are installed in residential areas, and it is desirable that they have no sharp points at the upper corners of the enclosure formed by three intersecting planes of sheet metal. It is also important to provide and maintain tamper-resistant interfaces between the terminal cover and the transformer tank, and between the terminal cover and the sill. Enclosures of the prior art conform to the requirement relative to the elimination of sharp points at the upper corners, but they all have certain disadvantages, including complicating the tamper-resistant interfaces, complicating the welding of the tank cover, or requiring larger than necessary tanks which requires more liquid dielectric than necessary.

SUMMARY OF THE INVENTION

Briefly, the present invention is a new and improved padmounted transformer enclosure in which the composite enclosure formed by the transformer tank and terminal cover has no sharp upper corners, and the temper-resistant interfaces between the terminal cover and the tank, and between the terminal cover and the sill, are devoid of curves. Further, the padmounted transformer enclosure is of the top loaded design, i.e., the tank has an opening at its top for receiving the core-coil assembly, with the tank cover and the tank flanges to which the cover is welded, being flat. An L-shaped front/bottom member is welded to a U-shaped wrap, which forms the remaining three sides of the tank. The size of the oil compartment is selected by raising the bottom and varying the length of the legs of the U-shaped tank warp.

BRIEF DESCRIPTION OF THE DRAWINGS

The invention may be better understood, and further advantages and uses thereof more readily apparent, when considered in view of the following detailed description of exemplary embodiments, taken with the accompanying drawings, in which.

DESCRIPTION OF THE PREFERRED EMBODIMENTS

Figure 1:
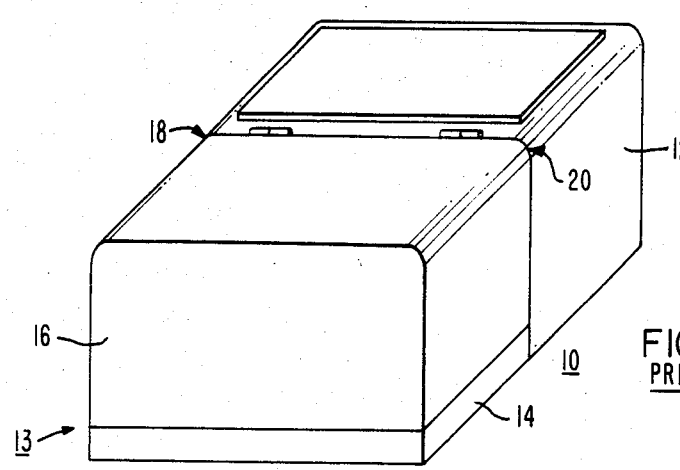
FIG. 1 is a perspective view of a prior art padmounted transformer enclosure which eliminates sharp upper corners with a side-to-side curvature.

Referring now to the drawings, FIG. 1 is a perspective view of a padmounted transformer enclosure 10 constructed according to the teachings of the prior art. Padmounted transformer enclosure 10 includes a tank 12 and a cabinet 13, with the cabinet 13 including a sill 14 and a terminal cover 16. Sharp upper corners are eliminated by a side-to-side curvature in which both the tank 12 and terminal cover 16 are radiused on their first and second top side edges 18 and 20, respectively. Achieving tamper resistance is complicated with this design because of the radius on the tank and terminal cover which must match.

Figure 2:
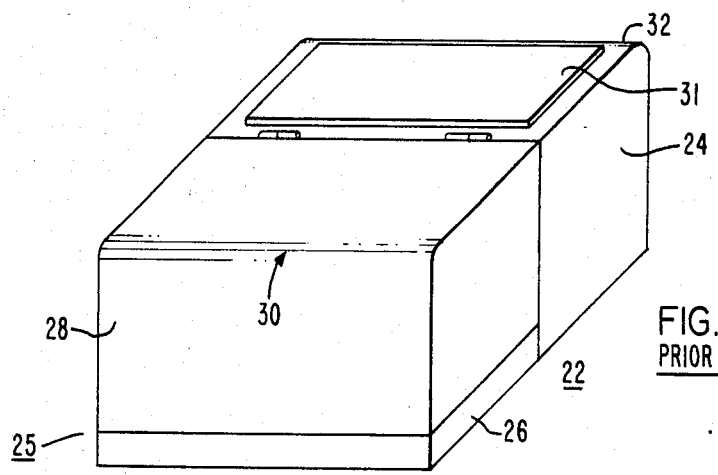
FIG. 2 is a perspective view of a prior art padmounted transformer enclosure which eliminates sharp upper corners with a front-to-back curvature.

FIG. 2 is a perspective view of a padmounted transformer enclosure constructed according to the teachings of the prior art. Padmounted transformer enclosure 22 includes a tank 24 and a cabinet 25 with the cabinet 25 including a sill 26 and a terminal cover 28. Sharp upper corners are eliminated by a front-to-back curvature in which the top front edge 30 of the terminal cover 28 is radiused, and the top, back edge 32 of the tank is radiused. The radius 32 on the top back edge of the tank 24 causes one of two different problems associated with the welding of a tank cover 31. If the opening in the top of the tank extends completely to the back edge of the tank, a curvature must be formed into the tank cover 31 and the operation to weld the cover to the tank is much more difficult than if the cover were flat. If, however, the curvature is formed into the upper, back edge of the tank and the tank cover is flat, the tank must be dimensioned with a greater front to back dimension than it would otherwise need to be merely to allow entry of the core-coil assembly. This increases the manufacturing cost of the transformer, because more oil is required to maintain the same oil dimension above the core-coil assembly.

Figure 3:
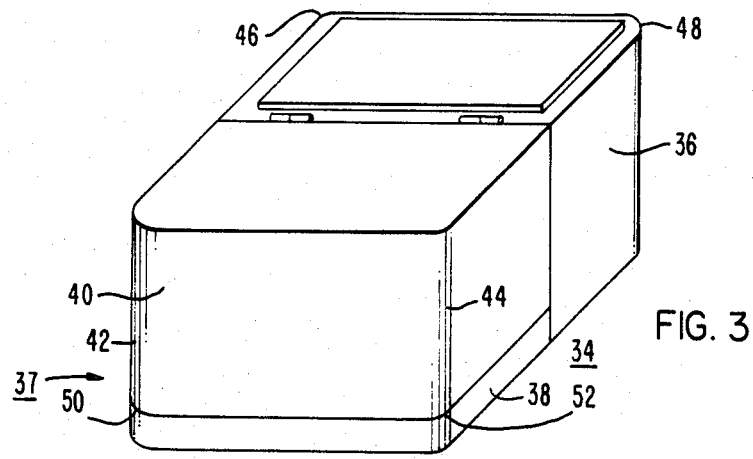
FIG. 3 is a perspective view of a padmounted transformer enclosure which eliminates sharp upper corners with a corner-to-corner curvature.

FIG. 3 is a perspective view of a padmounted transformer enclosure 34 which also could be used to eliminate sharp upper corners. Transformer enclosure 34 includes a tank 36 and a cabinet 37, with the cabinet 37 having a sill 38 and a terminal cover 40. Sharp upper corners are eliminated with a corner-to-corner curvature which radiuses all four vertical edges, i.e., the first and second vertical front edges 42 and 44 of the cabinet 37, and the first and second vertical rear edges 46 and 48, respectively, of the tank 36. This arrangement, however, has a problem in that the sill 38 and cabinet 40 would have to have exactly the same curvature at the interface points 50 and 52, making it difficult to design, manufacture and maintain tamper resistance.

Figure 4:
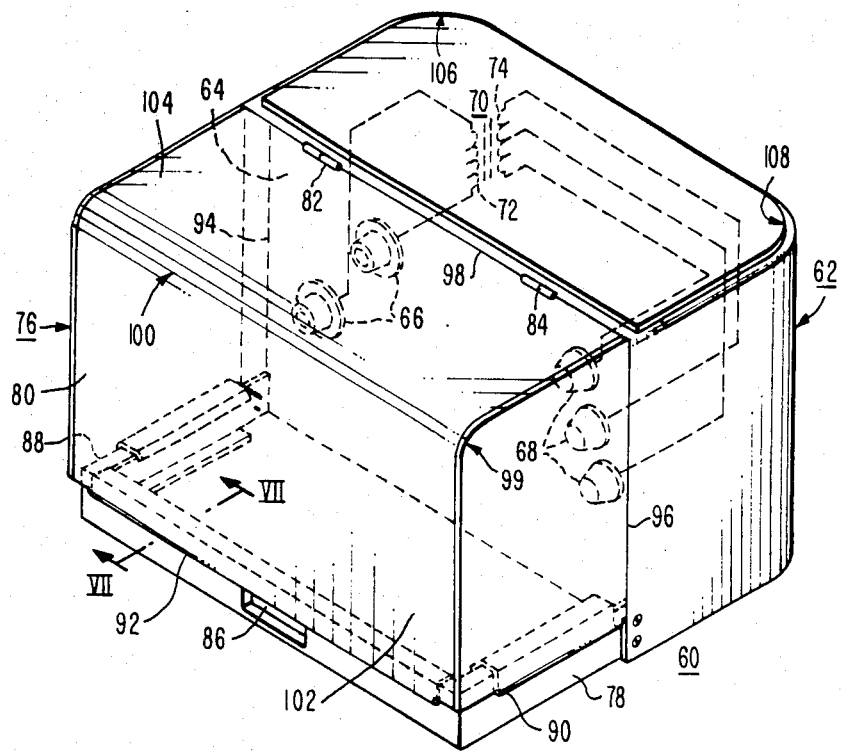
FIG. 4 is a perspective view of a padmounted transformer enclosure constructed according to the teachings of the invention, having square tamper-resistant interfaces and no sharp upper corners.

FIG. 4 is a perspective view of a padmounted transformer enclosure 60 constructed according to the teachings of the invention. Transformer enclosure 60 incudes an enclosed metallic tank 62 having a front surface 64 on which the electrical terminals are mounted, such as high voltage bushings 66 and low voltage bushings 68. A core-coil assembly 70 is disposed within tank 62, immersed in a suitable liquid dielectric, such as mineral oil. The core-coil assembly 70 includes a primary winding 72 which is connected to the high voltage bushings, 66, and a secondary winding 74 which is connected to the low voltage bushings 68.

Figures 6, 7:
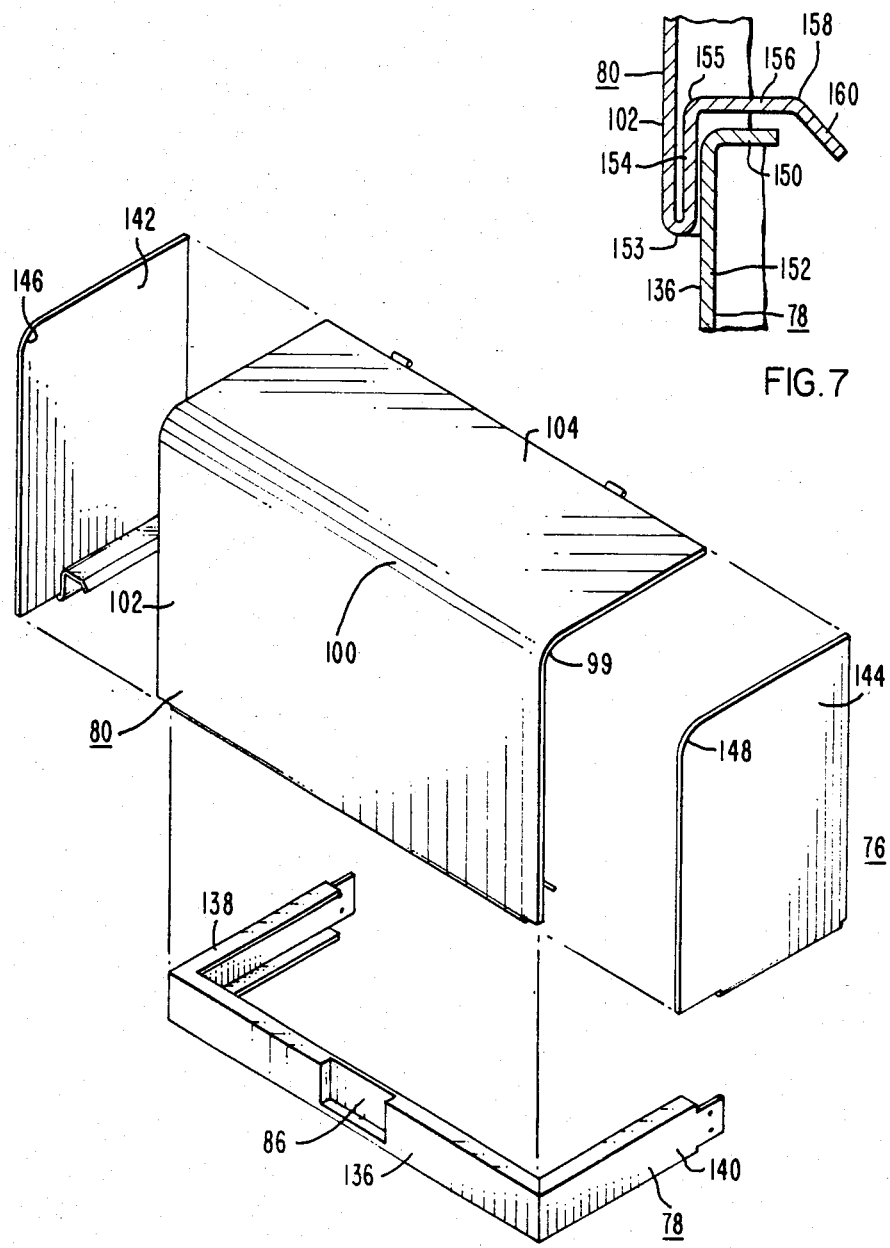
FIG. 6 is an exploded perspective view of the terminal cover shown in FIG. 4, illustrating how the terminal cover is formed from three basic members.
FIG. 7 is a cross-sectional view of the terminal cover-sill interface, taken between and in the direction of arrows VII—VII in FIG. 4.

A cabinet or compartment 76 is formed adjacent to the front 64 of tank 62, for enclosing the bushings 66 and 68, the cables which rise from the ground and connect to the bushings, as well as the other items commonly disposed on the front 64 of the tank 62. Cabinet 76 includes a U-shaped sill 78 which is attached to the tank 62, and a terminal cover or hood 80 which is pivotally attached to the tank 62 via hinges 82 and 84. Terminal cover 80 has an open position (not shown) which enables authorized personnel to gain access to the cable and terminal compartment and the closed position illustrated. In the closed position, cover 80 is locked to the sill 78 via a padlock (not shown) in a sill recess 86 and the cover 80 cooperates with the sill 78 to provide tamper-resistant side interfaces 88 and 90, and a front interface 92. Cover 80 also cooperates with the tank 62 to provide tamper-resistant side interfaces 94 and 96, and a top interface 98. A tamper-resistant interface construction suitable for the side interfaces 94 and 96, and the top interface 98, is disclosed in concurrently filed application Ser. No. 618,843. FIG. 7 illustrates a tamper-resistant interface which may be used for the interfaces 88, 90 and 92.

According to the teachings of the invention, the problems associated with the arrangements shown in FIGS. 1, 2 and 3 are eliminated by utilizing a front-to-back curvature 99 at the upper edge 100 between the front and top portions 102 and 104, respectively, of the terminal cover 80, and corner-to-corner curvatures 106 and 108 between the back portion 110 and first and second side wall portions 112 and 114 of the tank 62. The arrangement of FIG. 4 eliminates sharp upper corners on the composite structure created by the tank 62 and cabinet 76, and it has all straight interfaces and square interface corners where the tank 62 and terminal cover 80 meet, i.e., interfaces 94, 96 and 98, as well as where the sill 78 and the terminal cover 80 meet, i.e., interfaces 88, 90 and 92. Further, the top of tank 62 is flat, eliminating the welding problem associated with a curved cover, as well as eliminating the excess oil problem associated with the front-to-back curvature of the prior art transformer 22 shown in FIG. 2.

Figure 5:
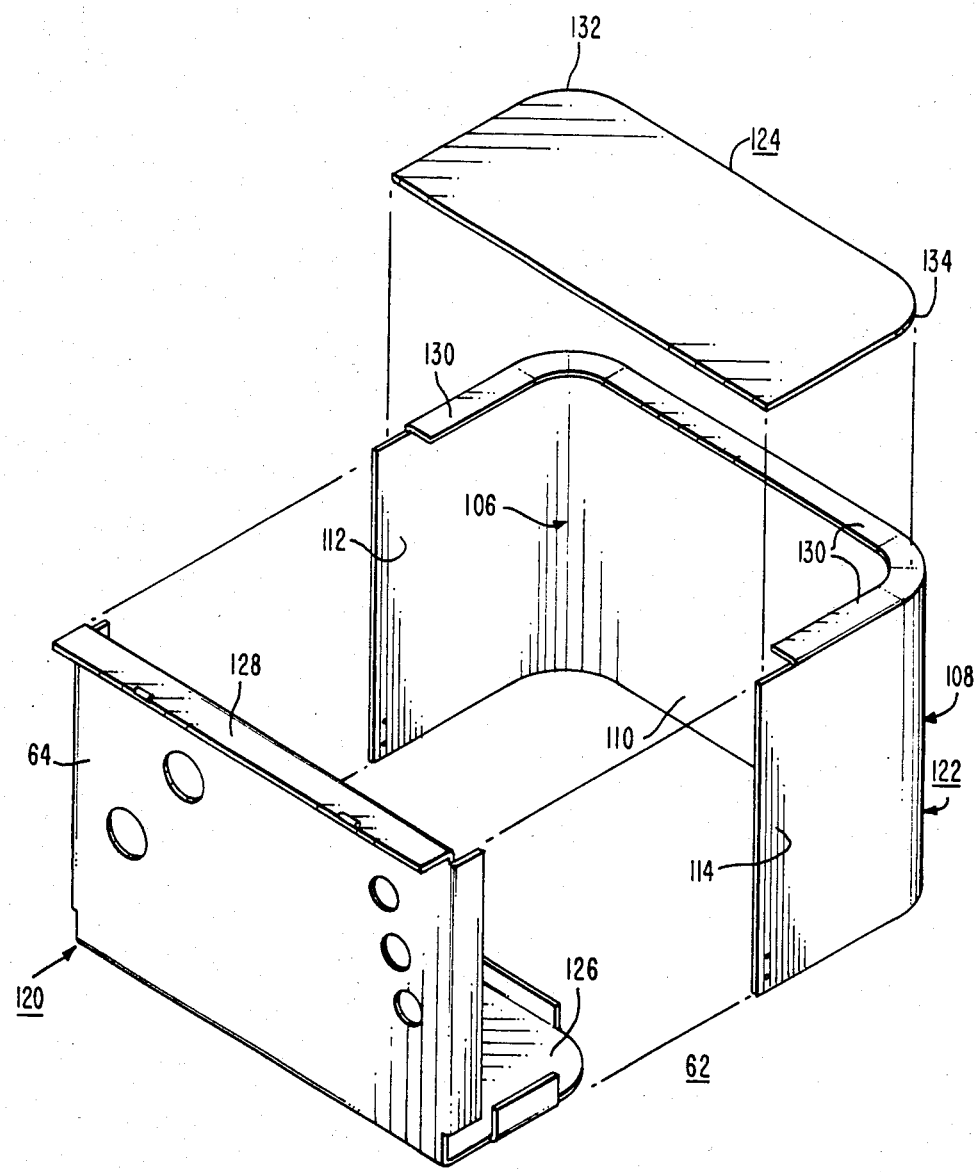
FIG. 5 is an exploded perspective view of the tank shown in FIG. 4, illustrating how the tank is formed from three basic members.

Padmounted transformer enclosure 60 shown in FIG. 4 may be easily constructed, according to the teachings of the invention, with FIG. 5 being an exploded, perspective view of tank 62, and FIG. 6 being an exploded, perspective view of cabinet 76. Tank 62 shown in FIG. 5 includes first, second and third basic members 120, 122 and 124, respectively. The first basic member 120 is substantially L-shaped, with one of the legs of member 120 forming the front 64 which is the terminal wall of the tank 62, and the remaining leg forming a bottom 126 for the tank 62. The second basic member 122 is substantially U-shaped, with the bight forming the back wall 110 of tank 62, and the legs of the U-shaped configuration forming the first and second side wall portions 112 and 114. The upper edge of the front wall 64 is flanged at 128, as are the upper edges of member 122, indicated at 130. Members 120 and 122 are welded together to create an enclosure having an opening at its upper end. After the bushings 66 and 68 are mounted on the front wall 64, the core-coil assembly 70 is mounted in tank 122, and the tank 62 is filled with a liquid dielectric, such as mineral oil. The third basic member 124, which is a substantially flat sheet of steel functioning as the tank cover, is placed on the flanges 128 and 130 and welded thereto. The flat cover 124 is radiused at its back two corners 132 and 134 to match the radii of the curved vertical corners 106 and 108, respectively. Concurrently filed application Ser. No. 618,844 may be referred to for arrangements for welding tank cover 124 which prevents heat damage to certain critical areas, including the terminal wall or front 64.

FIG. 6, which is an exploded perspective view of cabinet 76 includes a sill 78 and a terminal cover 80. Sill 78 is a U-shaped piece of formed sheet metal having a bight 136 and first and second leg portions 138 and 140, respectively, which join bight 136 with right angle configurations. The cross-sectional configuration of the bight and leg portions may be channel shaped, for example. The vertical front and side surfaces of sill 78 are flush with the sides of the tank 62 and cabinet 76, with the sill including means (not shown) associated with sill recess 86 for locking terminal cover 80 to sill 78.

The terminal cover 80 includes an L-shaped cabinet wrap with one leg forming front 102 and the other leg forming the top 104. Left and right hand side members 142 and 144 are welded to the ends of the L-shaped wrap, with members 142 and 144 being radiused at 146 and 148, respectively, to match the radius 99 associated with the curved edge 100 of the terminal cover 80.

FIG. 7 is a cross-sectional view, taken between and in the direction of arrows VII—VII in FIG. 4, illustrating a tamper-resistant interface which may be used for the sill interfaces 88, 90 and 92. As hereinbefore stated, sill 78 may have a channel-shaped cross-sectional configuration, including an upper leg or lip 150 which bends inwardly from a bight 152 at a right angle. The bottom edge of terminal cover 80 may be bent back on itself at bend 153 and then bent perpendicularly outward at bend 155 to form portions 154 and 156. Another bend 158 directs a portion 160 downwardly, to deflect a wire or other object that may be pushed through the interface downwardly towards the ground. As hereinbefore stated, the terminal cover to tank interface may use the tamper-resistant joint construction set forth in concurrently filed application Ser. No. 618,843.

Sill 78 is bolted to tank 62, and the terminal cover 80 is pivotally attached to the tank 62, to complete the padmounted transformer enclosure 60.

We claim as our invention:

1. A padmounted transformer enclosure, comprising:
    a tank having electrical terminals on a predetermined wall,
    and a terminal cover pivotally attached to said tank to enclose said predetermined wall,
    said tank and terminal cover, when closed, cooperatively defining a composite structure having a front portion formed by said terminal cover, a rear portion formed by said tank, and cooperatively formed side portions,
    said front portion having a horizontally oriented upper edge, and said back portion having first and second substantially vertically oriented edges, all of which are radiused to eliminate sharp points at the upper corners of said composite structure.

2. The padmounted transformer enclosure of claim 1 wherein the cooperatively formed side portions of the composite structure each define an upper edge which has a right-angle configuration in cross section, eliminating the necessity of matching radii at the tank-cover interface.

3. The padmounted transformer enclosure of claim 1 including a sill attached to the tank which supports the terminal cover which the cover is closed, with said sill having a bight portion and first and second leg portions joined thereto with first and second right angle configurations, respectively, and wherein the terminal cover has first and second vertically oriented edges having right angle con figurations which match the first and second right angles, respectively, of said sill, eliminating the necessity of matching radii at the cover-sill interface.

4. The padmounted transformer enclosure of claim 1 wherein the rear portion has a horizontally oriented upper edge which defines a right angle configuration in cross section, and including a flat cover fixed to said tank, including the upper edge of the rear portion of the tank.

5. The padmounted transformer enclosure of claim 1 wherein the tank includes an L-shaped member and a U-shaped member,
    said L-shaped member having first and second leg portions defining vertically and horizontally oriented flat surfaces, respectively, with said vertical surface being the predetermined wall,
    said U-shaped member including a bight having a vertically oriented flat surface which forms the rear portion of the composite structure, and first and second leg portions connected to the bight to form the radiused edges of the back portion, and a cover attached to the first leg portion of said L-shaped member and to the first and second leg portions and bight of said U-shaped member.

6. The padmounted transformer enclosure of claim 1 wherein the terminal cover includes an L-shaped member having first and second ends each defined by first and second leg portions which are joined to form the radiused edges of the front portion of the composite structure, and first and second flat end portions attached to the first and second ends, respectively, of said L-shaped member.

7. A padmounted transformer enclosure, comprising:
    a tank having side wall, front, rear, bottom and cover portions,
    electrical terminals on said front portion,
    a sill attached to said tank,
    and a terminal cover pivotally attached to said tank to enclose its front wall portion,
    said terminal cover and said tank cooperatively forming straight, tamper-resistant interfaces,
    said terminal cover including front, top and side portions,
    said terminal cover having a curved edge between its front and top portions,
    said tank having curved edges between its rear and side wall portions.

8. The padmounted transformer enclosure of claim 7 wherein the front and bottom portions of the tank are formed integrally from a common metallic sheet, and the side wall and rear portions are integrally formed from a common metallic sheet, with the height of the front and length of the side wall portions determining tank capacity.

* * * * *